United States Patent

Shimura

[19]

[11] Patent Number: 5,982,254
[45] Date of Patent: Nov. 9, 1999

[54] LADDER FILTER HAVING AN OPTIMAL ARRANGEMENT OF PIEZOELECTRIC RESONATORS IN A CASE

[75] Inventor: Takashi Shimura, Komatsu, Japan

[73] Assignee: Murata Manufacturing Co., Ltd., Japan

[21] Appl. No.: 09/079,348

[22] Filed: May 15, 1998

[30] Foreign Application Priority Data

Jul. 7, 1997 [JP] Japan .................................... 9-181254

[51] Int. Cl.⁶ .............................. H03H 9/58; H03H 9/60
[52] U.S. Cl. ............................................ 333/189; 310/352
[58] Field of Search ..................................... 333/189, 190; 310/348, 352, 366

[56] References Cited

U.S. PATENT DOCUMENTS

| | | | |
|---|---|---|---|
| 5,260,675 | 11/1993 | Ogawa et al. | 333/189 |
| 5,525,944 | 6/1996 | Oyama | 333/189 |
| 5,543,763 | 8/1996 | Oyama | 333/189 |
| 5,705,880 | 1/1998 | Shimura et al. | 333/189 X |

FOREIGN PATENT DOCUMENTS

| | | | |
|---|---|---|---|
| 59-210713 | 11/1984 | Japan | 333/189 |
| 4-252607 | 9/1992 | Japan | 333/190 |
| 6-152316 | 5/1994 | Japan | 333/190 |
| 6-204786 | 7/1994 | Japan | 333/190 |

*Primary Examiner*—Robert Pascal
*Assistant Examiner*—Barbara Summons
*Attorney, Agent, or Firm*—Graham & James LLP

[57] ABSTRACT

A highly reliable ladder filter has a simple structure and is adapted to be readily assembled automatically for less cost. The ladder filter includes a case including storage sections which are adjacent to each other. A first series piezoelectric resonator, a second series piezoelectric resonator and a second parallel piezoelectric resonator are stored in one storage section such that the second series piezoelectric resonator is located between the first series resonator and the parallel resonator. A first parallel piezoelectric resonator, a third parallel piezoelectric resonator and a third series piezoelectric resonator are stored in the other storage section such that the third parallel piezoelectric resonator is located between the first parallel resonator and the third series resonator. The first series piezoelectric resonator is disposed adjacent to the first parallel piezoelectric resonator such that the partition wall is located therebetween.

8 Claims, 6 Drawing Sheets

LADDER FILTER HAVING AN OPTIMAL ARRANGEMENT OF PIEZOELECTRIC RESONATORS IN A CASE

BACKGROUND OF THE INVENTION

1. Field of the Invention

The present invention relates to a ladder filter and more particularly, to a ladder filter constructed for use in processing signals of a KHz band in an intermediate frequency amplifying stage of an AM receiver and similar devices.

2. Description of Related Art

A related ladder filter 20 is shown in FIGS. 8 and 9 and disclosed in Japanese Patent Laid-Open No. Hei. 6-334473. The ladder filter 20 includes a case 1 having two internal spaces 2 and 3 separated by a partition 4. Each of the internal spaces 2 and 3 has an opening at an upper part thereof. Piezoelectric resonators 5–10 and terminals 11–17 are arranged so as to overlap each other in the internal spaces 2 and 3, respectively. That is, the terminal 11, the piezoelectric resonator 5, the terminal 12, the piezoelectric resonator 6, the terminal 13, the piezoelectric resonator 7 and the terminal 14 are laminated within the internal space 2 in this order. The terminal 15, the piezoelectric resonator 8, the terminal 11, the piezoelectric resonator 9, the terminal 16, the terminal 12, the piezoelectric resonator 10 and the terminal 17 are laminated within the internal space 3 in this order.

The terminal 11 upon which the piezoelectric resonator 5 is disposed is also located between the piezoelectric resonators 8 and 9. The terminal 12 disposed between the piezoelectric resonators 5 and 6 is extended between the piezoelectric resonator 10 and the terminal 16. The terminal 12 is electrically insulated from the terminal 16 which is in contact with the piezoelectric resonator 9.

The ladder filter 20 has a circuit structure as shown in FIG. 9, wherein the piezoelectric resonators 8, 5 and 6 are series piezoelectric resonators of the ladder filter circuit and the piezoelectric resonators 9, 10 and 7 are parallel piezoelectric resonators of the ladder filter circuit. The terminal 15 functions as an input terminal, the terminals 14, 16 and 17 function as ground terminals and the terminal 13 functions as an output terminal, respectively.

The two terminals 12 and 16 are disposed between the piezoelectric resonators 9 and 10 in the prior art ladder filter 20. The terminal 12 functions as a relay terminal for electrically connecting the series piezoelectric resonator 5 with the series piezoelectric resonator 6 and the other terminal 16 functions as the ground terminal, such that the terminal 12 must be electrically insulated from the terminal 16 within the case 1.

The terminals 12 and 16 are insulated by interposing an insulator sheet between the terminals 12 and 16 or disposing a coating insulator on either one or both of the terminals 12, 16. Accordingly, the structure of the ladder filter 20 is complicated which increases the difficulty, time and cost involved in manufacturing and assembling the filter 20. In addition, the above-described construction and configuration of the components of the filter 20 has made it very difficult to miniaturize the filter and to assure high reliability.

Furthermore, because the five terminals 13–17 extend out of the case 1 as seen in FIG. 9, the cost for molding the terminals is very high and the rate of failure in reliably mounting the filter 20 and terminals 13–17 on a printed board increases as the number of terminals increases.

SUMMARY OF THE INVENTION

To overcome the problems described above, the preferred embodiments of the present invention provide a highly reliable ladder filter which has a simple structure, which is adapted to be easily automatically assembled, and has a significantly reduced size and reduced cost of manufacturing.

The preferred embodiments of the present invention provide a ladder filter including a case; first, second and third series piezoelectric resonators provided in the case; first, second and third parallel piezoelectric resonators provided in the case; and terminal members which connect the first, second and third series piezoelectric resonators and the first, second and third parallel piezoelectric resonators in a ladder configuration and support the first, second and third series and parallel resonators in the case so that the resonators resonate freely; wherein the case has first and second storage sections adjacent to each other; the first and second series piezoelectric resonators and the second parallel piezoelectric resonator are stored in the first storage section such that the second series piezoelectric resonator is located between the first series piezoelectric resonator and the second parallel piezoelectric resonator; the first and third parallel piezoelectric resonators and the third series piezoelectric resonator are stored in the second storage section such that the third parallel piezoelectric resonator is located between the first parallel piezoelectric resonator and the third series piezoelectric resonator; and the first series piezoelectric resonator and the first parallel piezoelectric resonator are adjacent to each other in the case.

With the novel construction and arrangement of the preferred embodiments of the present invention, the various terminals are separate from each other while still surrounding resonators located therebetween. As a result of this arrangement, it is unnecessary to electrically insulate areas between the terminals, and it is unnecessary to provide an insulator sheet between the terminals or to apply an insulator to the terminals. Accordingly, the number of ground terminals and other parts are reduced, and the structure of the ladder filter is simplified. Further, this construction allows the ladder filter to be less expensive because it can be assembled easily and can be readily assembled automatically. Further, because the number of ground terminals extending out of the case is reduced, failures in mounting the filter on a printed board or the like are reduced.

In the above described ladder filter, a first input/output terminal may be electrically connected to the first series piezoelectric resonator; a second input/output terminal may be electrically connected to the third parallel piezoelectric resonator; and the first series piezoelectric resonator and the first parallel piezoelectric resonator may be disposed on the side of a mounting surface of the case.

A number of resonators shielded by the ground terminals increases by disposing the first series piezoelectric resonator and the first parallel piezoelectric resonator on the side of the case which includes the surface to be mounted on a printed circuit board. Accordingly, it is possible to suppress the influence of noise from outside of the filter.

In the above described ladder filter, the third series piezoelectric resonator may be thicker than each of the first and second series piezoelectric resonators. When the thickness of the third series piezoelectric resonator is increased, an electrostatic capacitance thereof is reduced. Accordingly, the ratio of electrostatic capacitance of the series piezoelectric resonator and that of the parallel piezoelectric resonator increases, improving the attenuation characteristic of the ladder filter.

Other features and advantages of the present invention will become apparent from the following description of preferred embodiments of the invention which refers to the accompanying drawings.

DETAILED DESCRIPTION OF PREFERRED EMBODIMENTS

Figure 1:
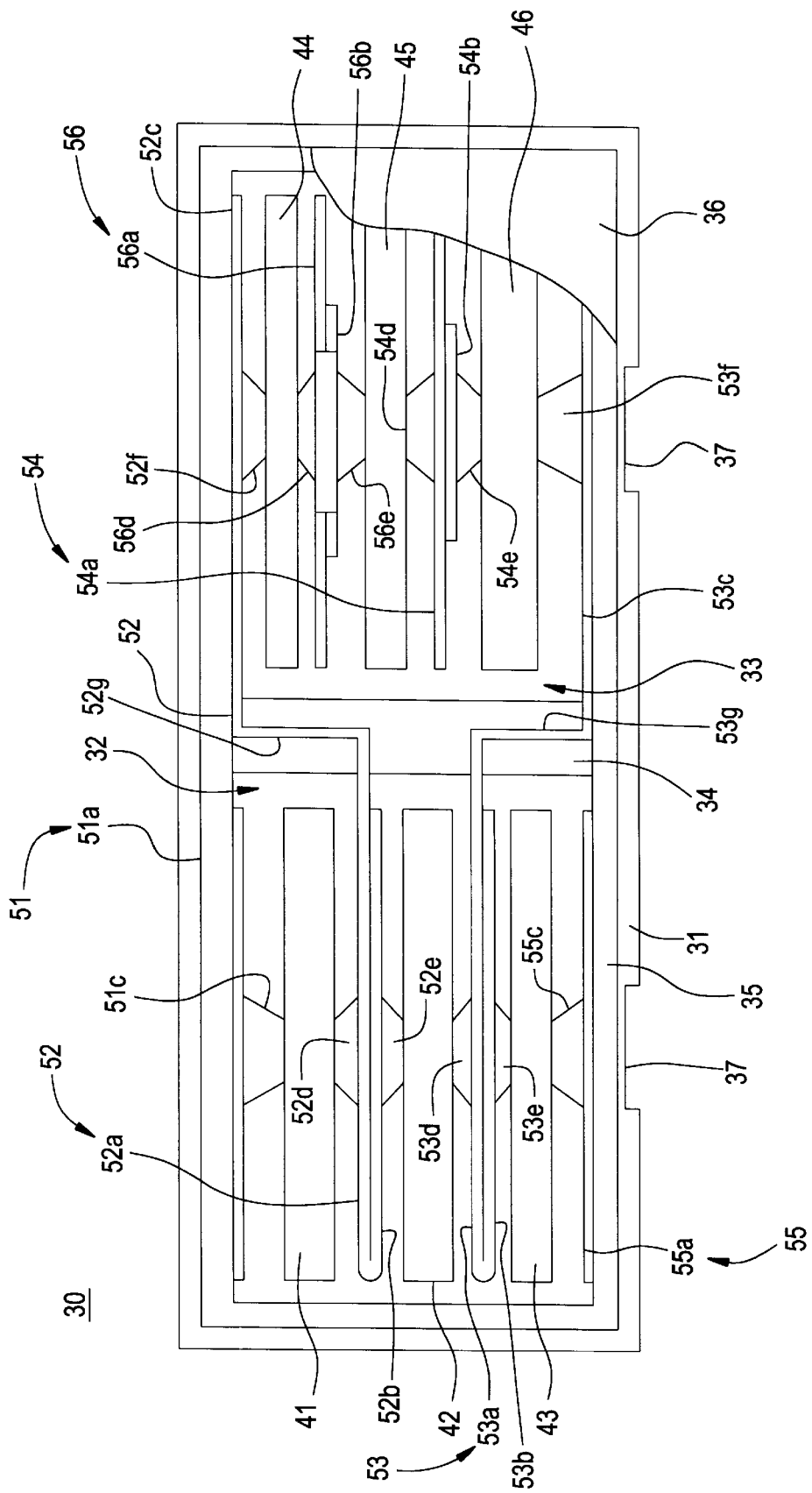
FIG. 1 is a partially cutaway front view of a ladder filter according to a first preferred embodiment of the present invention.
Figure 2:
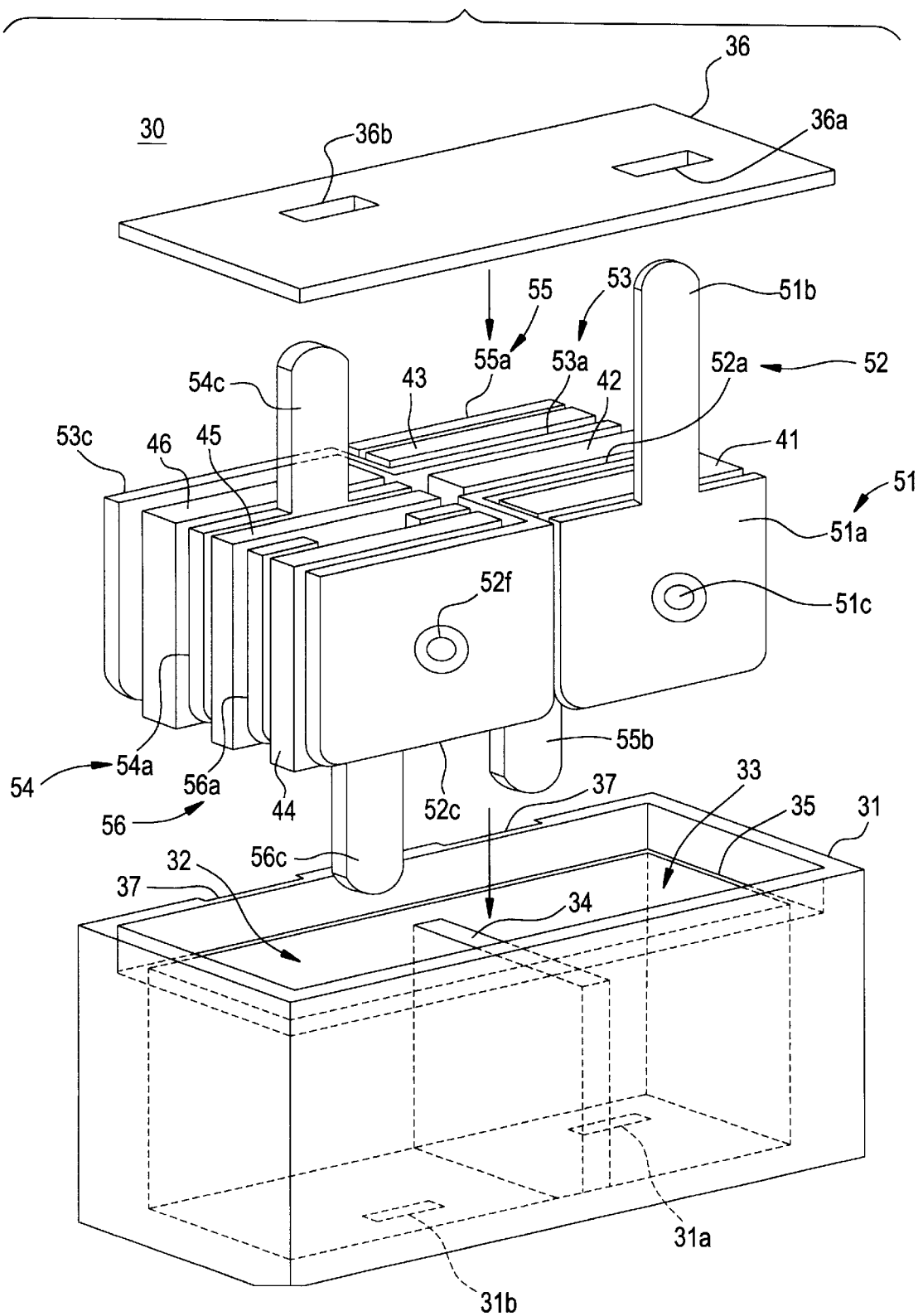
FIG. 2 is an exploded perspective view of the ladder filter of FIG. 1.

As shown in FIGS. 1 and 2, a ladder filter 30 preferably includes a substantially rectangular parallelepiped case 31. The case 31 has storage sections 32 and 33 which are separated by a partition wall 34. A first series piezoelectric resonator 41, a second series piezoelectric resonator 42 and a second parallel piezoelectric resonator 43 are stored in the storage section 32 such that the second series piezoelectric resonator 42 is located between the first series piezoelectric resonator 41 and the second parallel piezoelectric resonator 43. A first parallel piezoelectric resonator 44, a third parallel piezoelectric resonator 45 and a third series piezoelectric resonator 46 are stored in the storage section 33 such that the third parallel piezoelectric resonator 45 is located between the first parallel piezoelectric resonator 44 and the third series piezoelectric resonator 46. The first series piezoelectric resonator 41 is disposed adjacent to the first parallel piezoelectric resonator 44 and separated from each other by the partition wall 34 located therebetween.

The first through third series piezoelectric resonators 41, 42 and 46 as well as the first through third parallel piezoelectric resonators 43–45 preferably are known resonators which include resonance electrodes extending almost along on the whole surface of both sides of a piezoelectric substrate and resonate in a square or disk type vibration mode.

In the first preferred embodiment, thicknesses of the first through third series piezoelectric resonators 41, 42 and 46 are preferably equal and may have a thickness of, for example, about 500 μm. The thicknesses of the first through third parallel piezoelectric resonators 43–45 may preferably be set to, for example, about 250 μm.

As shown in FIG. 2, the case 31 has an opening at one side thereof and a stepped portion 35 is provided at the opening. One end of the partition wall 34 recedes from the stepped portion 35 to the inside of the case 31. A lid member 36 is fixed at the opening of the case 31 and fits with the stepped portion 35. Connector portions 52g and 53g of terminals 52 and 53 described later are disposed in a gap provided between the lid member 36 and the partition wall 34.

Figure 3:
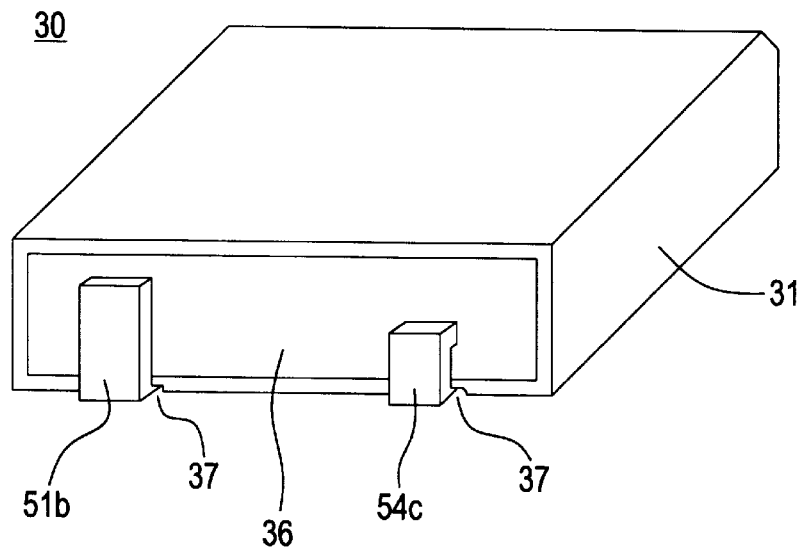
FIG. 3 is a perspective view showing an appearance of the ladder filter of FIG. 1.

An input terminal 51 includes an electrode portion 51a, a lead external connecting portion 51b which extends from one end of the electrode portion 51a and a projection 51c provided at the approximate center of the electrode portion 51a. The external connecting portion 51b extends out of the case 31 from a slit 36a provided in the lid member 36 which fits with the opening of the case 31 and is bent at right angles along the lid member 36 as shown in FIG. 3. An output terminal 54 includes electrode portions 54a and 54b, a lead external connecting portion 54c which extends out of one end of the electrode portion 54a and projections 54d and 54e provided at the approximate center of the electrode portions 54a and 54b. The external connecting portion 54c extends out of the case 31 from a slit 36b provided through the lid member 36 and is bent at right angles along the lid member 36.

A ground terminal 55 includes an electrode portion 55a, a lead external connecting portion 55b which extends out of one end of the electrode portion 55a and a projection 55c provided at the approximate center of the electrode portion 55a. The external connecting portion 55b extends out of the case 31 from a slit 31a (see FIG. 2) provided through the case 31 and is bent at right angles along the case 31.

A ground terminal 56 includes electrode portions 56a and 56b, a lead external connecting portion 56c which extends out of one end of the electrode portion 56a and projections 56d and 56e provided at the approximate center of the electrode portion 56a and 56b, respectively. The external connecting portion 56c extends out of the case 31 from a slit 31b (see FIG. 2) provided in the case 31 and is bent at right angles along the case 31.

A relay terminal 52 includes electrode portions 52a, 52b and 52c, projections 52d, 52e and 52f provided respectively at the approximate center of the electrode portions 52a, 52b and 52c and a connecting portion 52g connecting the electrode portions 52a, 52b and 52c. The connecting portion 52g is disposed in a gap provided between the lid member 36 and the partition wall 34. Similarly, a relay terminal 53 includes electrode portions 53a, 53b and 53c, projections 53d, 53e and 53f provided respectively at the approximate center of the electrode portions 53a, 53b and 53c and a connecting portion 53g connecting the electrode portions 53a, 53b and 53c. The connecting portion 53g is disposed in a gap provided between the lid member 36 and the partition wall 34.

After being formed preferably by stamping from one metal plate, the relay terminals 52 and 53 are folded such that the electrode portions 52b and 53b overlap with the electrode portions 52a and 53a, respectively. Similarly, after being formed preferably by stamping from one metal plate, the output terminal 54 and the ground terminal 56 are folded such that the electrode portions 54b and 56b overlap with the electrode portions 54a and 56a, respectively.

These terminals 51–56 hold and support the resonators 41–46 as follows. That is, the projections 51c and 52d provided respectively on the terminals 51 and 52 are pressed against the upper and lower surfaces of the first series piezoelectric resonator 41 to support the resonator 41 such that the resonator 41 is able to freely resonate. The projections 52e and 53d provided respectively on the terminals 52 and 53 are pressed against the upper and lower surfaces of the second series piezoelectric resonator 42 to support the resonator 42 such that the resonator 42 is able to freely resonate. The projections 53e and 55c provided respectively on the terminals 53 and 55 are pressed against the upper and lower surfaces of the second parallel piezoelectric resonator 43 to support the resonator 43 such that the resonator 43 is able to freely resonate. The projections 52f and 56d provided respectively on the terminals 52 and 56 are pressed against the upper and lower surfaces of the first parallel piezoelectric resonator 44 to support the resonator 44 such that the resonator 44 is able to freely resonate. The projections 56e and 54d provided respectively on the terminals 56 and 54 are pressed against the upper and lower surfaces of the third parallel piezoelectric resonator 45 to support the resonator 45 such that the resonator 45 is able to freely resonate. The projections 54e and 53f provided respectively on the terminals 54 and 53 are pressed against the upper and lower surfaces of the third series piezoelectric resonator 46 to support the resonator 46 such that the resonator 46 is able to freely resonate.

As shown in FIG. 3, the ladder filter 30 is preferably a surface mounting electronic component device including grooves 37 provided on a surface of a case 31 which functions as a mounting surface to be mounted on a printed board and the like.

Figure 4:
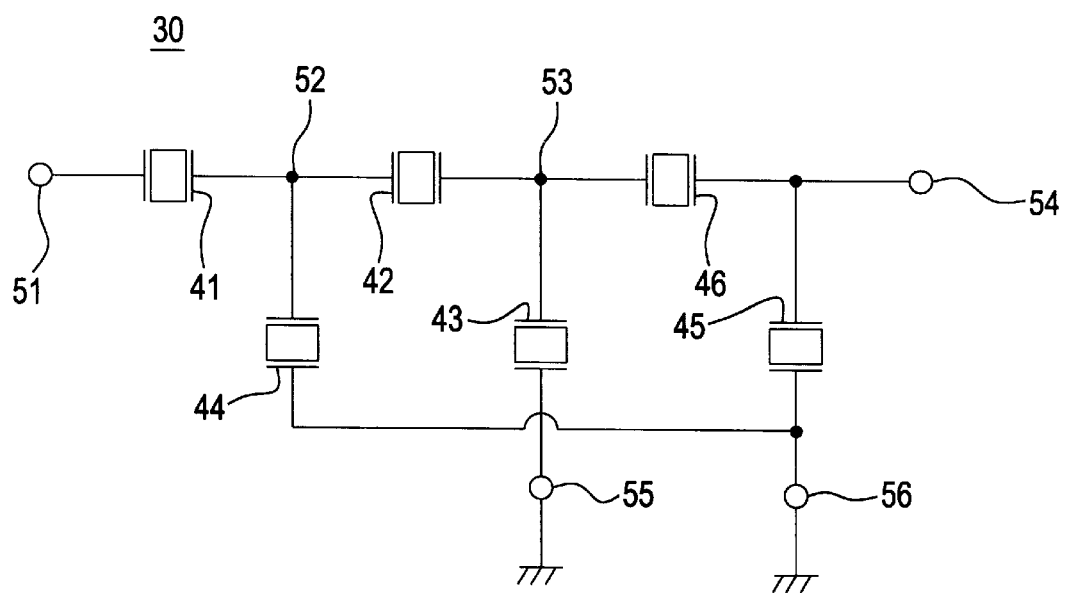
FIG. 4 is an electrical circuit diagram of the ladder filter in FIG. 1.

FIG. 4 shows an electrical circuit diagram of the ladder filter 30. The first series piezoelectric resonator 41, the second series piezoelectric resonator 42 and the third series piezoelectric resonator 46 are connected electrically in series sequentially from the side of the input terminal 51 between the input terminal 51 and the output terminal 54 via the relay terminals 52 and 53. The first parallel piezoelectric resonator 44 is connected electrically between an intermediate point of the first series piezoelectric resonator 41 and the second series piezoelectric resonator 42 and the ground terminal 56 via the relay terminal 52. The second parallel piezoelectric resonator 43 is connected electrically between the intermediate point of the second series piezoelectric resonator 42 and the third series piezoelectric resonator 46 and the ground terminal 55 via the relay terminal 53. The third parallel piezoelectric resonator 45 is connected electrically between the output terminal 54 and the ground terminal 56.

In the ladder filter 30 constructed as described above, two or more of the terminals 51–56 are not disposed between the two resonators which face each other at the same time. Accordingly, in contrast to the prior art ladder filter, it is not necessary to electrically insulate the different terminals 51–56 within the case 31. As a result, it is unnecessary to locate an insulator sheet between the terminals or to apply an insulator to the terminal and it is easy to assemble the ladder filter and achieve a reduction in the number of parts used to construct the ladder filter. Further, a number of ground terminals 55 and 56 extending outside of the case 31 is reduced. It is noted that a signal may be input from the output terminal 54 side and output from the input terminal 51 side in the ladder filter 30.

Figure 5:
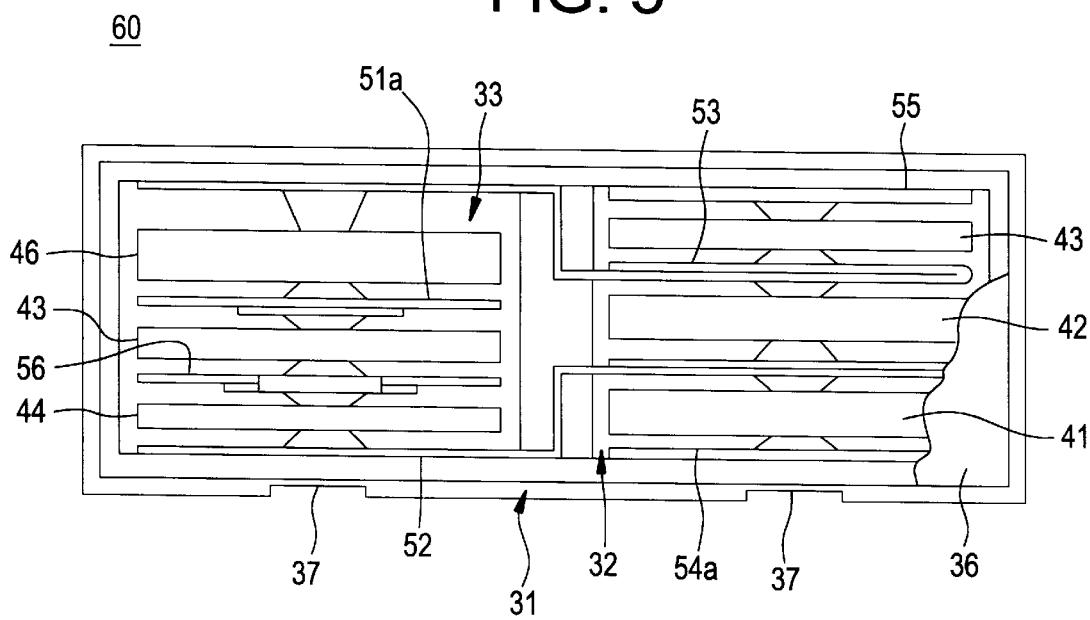
FIG. 5 is a partially cutaway front view of a ladder filter according to a second preferred embodiment of the present invention.
Figure 6:
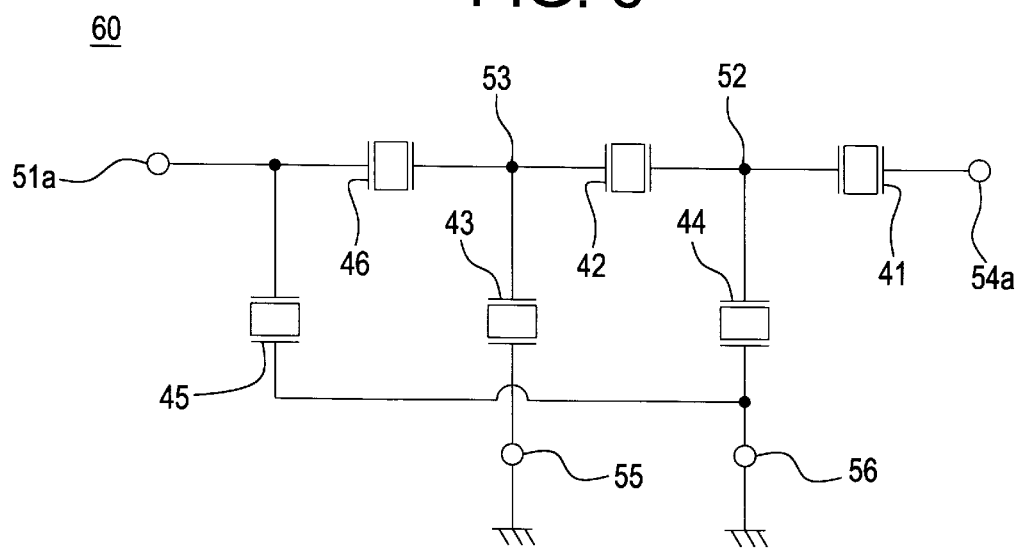
FIG. 6 is an electrical circuit diagram of the ladder filter of FIG. 5.

FIGS. 5 and 6 show a structure of a ladder filter according to a second preferred embodiment of the present invention. It is noted that in FIGS. 5 and 6, the components which correspond to those in FIGS. 1–4 are denoted by the same reference numerals to avoid repetition of explanation.

The ladder filter 60 is preferably the same as the ladder filter 30 of the first preferred embodiment described in FIG. 1 but is rotated by 180 degrees centering on an axis of rotation which passes through the center of the lid member 36. In the ladder filter 60, the output terminal 54 is used as an input terminal 51a and the input terminal 51 is used as an output terminal 54a.

By arranging the filter 60 as described above, the ground terminal 55 electromagnetically shields the first series piezoelectric resonator 41, the second series piezoelectric resonator 42 and the second parallel piezoelectric resonator 43 and the ground terminal 56 electromagnetically shields the first parallel piezoelectric resonator 44. Thereby, it is possible to prevent noise from the outside from entering the ladder filter 60 by shielding the filter via the ground terminals 55 and 56. A signal may be input from the output terminal 54a side and may be output from the input terminal 51a side also in the ladder filter 60.

Two relatively thick first and second series piezoelectric resonators 41 and 42 and one relatively thin second parallel piezoelectric resonator 43 are stored in the storage section 32 of the case 31, two relatively thin first and third parallel piezoelectric resonators 44 and 45 and one relatively thick third series piezoelectric resonator 46 are stored in the storage section 33 in the ladder filter 30 of the first preferred embodiment shown in FIG. 1. Accordingly, the resonators stored in the storage section 32 are not dimensionally symmetrical or balanced with respect to the resonators stored in the storage section 33.

An attenuation of ±100 KHz of the ladder filter is determined by a ratio of electrostatic capacitance of the series piezoelectric resonator and the electrostatic capacitance of the parallel piezoelectric resonator in general. Accordingly, the attenuation of ±100 kHz may be improved by reducing the electrostatic capacitance of the series piezoelectric resonator or by increasing the electrostatic capacitance of the parallel piezoelectric resonator.

Figure 7:
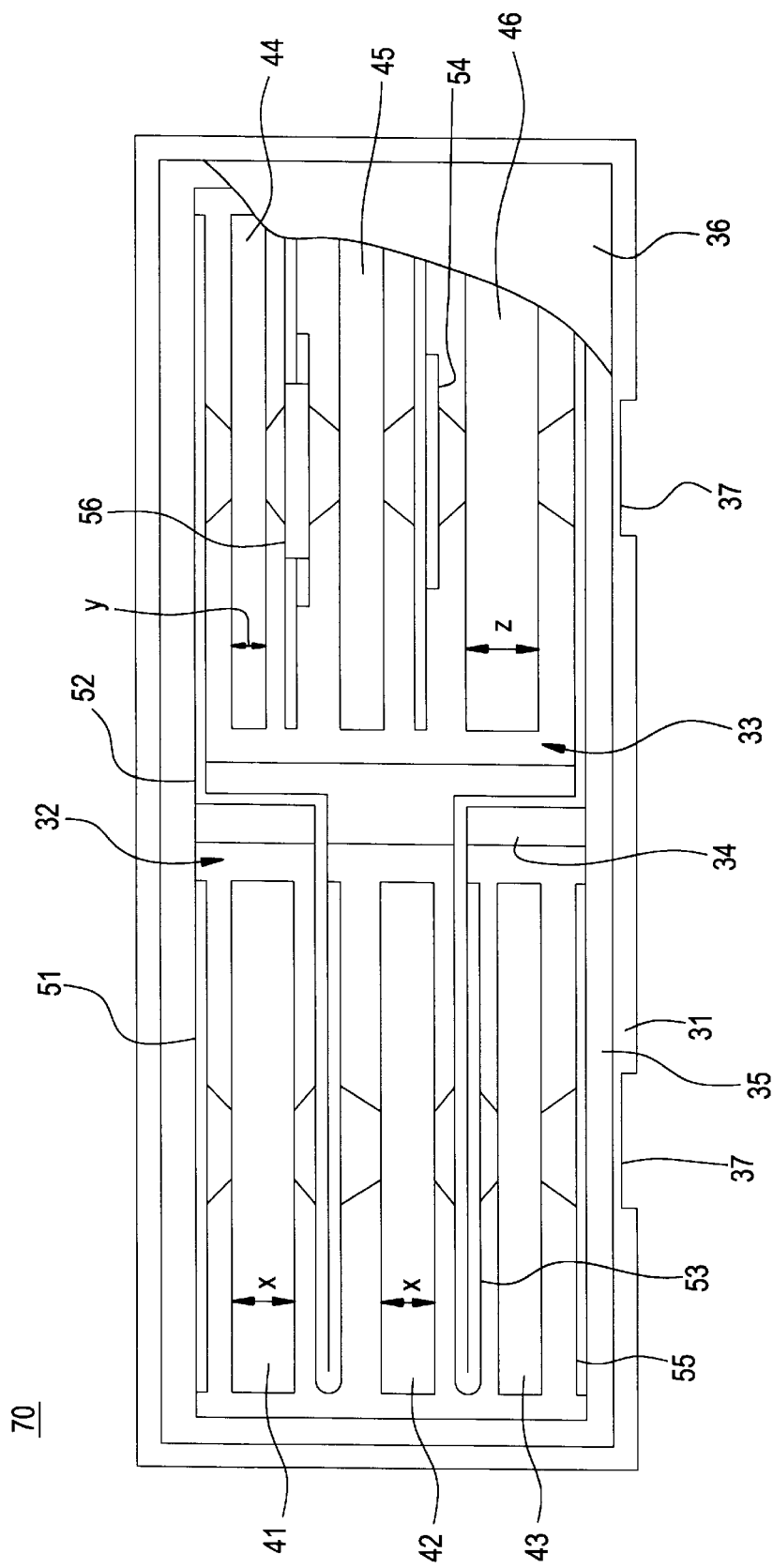
FIG. 7 is a partially cutaway front view of a ladder filter according to a third preferred embodiment of the present invention.
Figure 8:
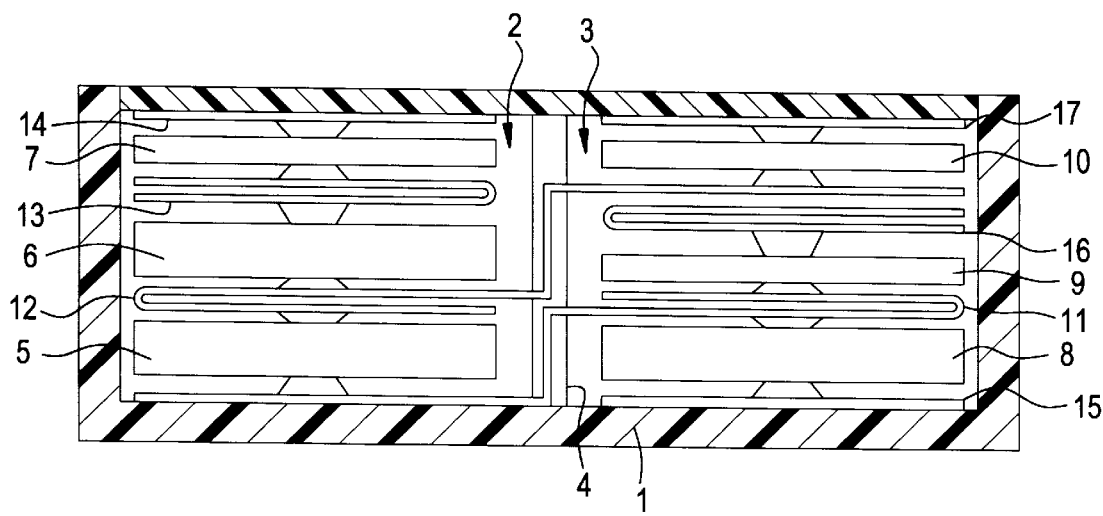
FIG. 8 is an explanatory diagram showing a structure of a prior art ladder filter.
Figure 9:
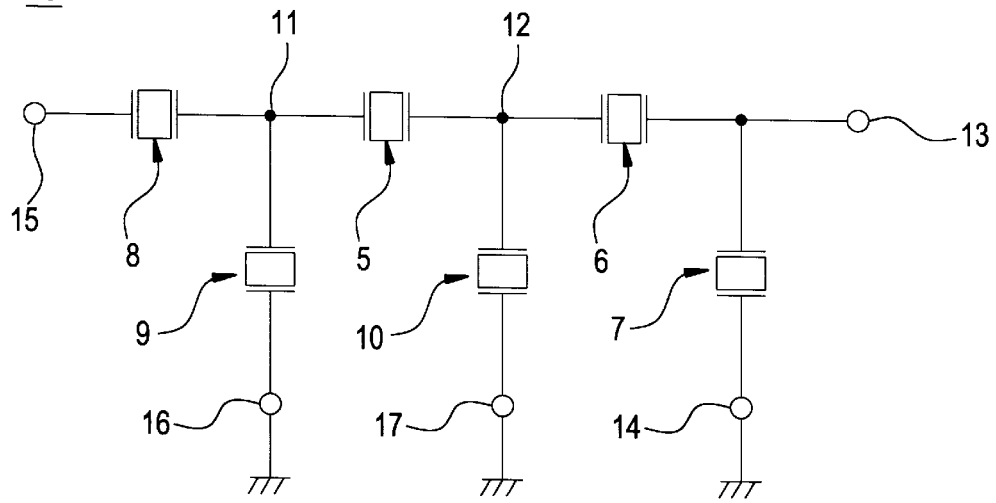
FIG. 9 is an electrical circuit diagram of the ladder filter of FIG. 8.

Then, according to the third preferred embodiment, the attenuation characteristic is improved and the dimensional unbalance is eliminated by increasing the thickness of the third series piezoelectric resonator 46 connected to the output terminal 54 side as compared to the thickness of the first and second series piezoelectric resonators 41 and 42 connected to the input terminal 51 side as shown in FIG. 7. It is preferable to arrange the resonators so as to satisfy a conditional expression of $x=z=2x-y$, where x is the thickness of the first and second series piezoelectric resonators 41 and 42, y is the thickness of the first, second and third parallel piezoelectric resonators 44, 43 and 45 and z is the thickness of the third series piezoelectric resonator 46.

When a sample of x=500 $\mu$m, y=250 $\mu$m and z=500 $\mu$m was fabricated together with a comparative sample of x=500 $\mu$m, y=250 $\mu$m and z=500 $\mu$m and the attenuation of ±100 KHz of respective samples were measured, a result as shown in the following Table 1 was obtained.

TABLE 1

| | Guaranteed Attenuation of ±100 kHz |
|---|---|
| z = 500 $\mu$m | 52.5 dB |
| z = 700 $\mu$m | 54.5 dB |

It is apparent from Table 1 that the attenuation of ±100 KHz of the ladder filter 70 in which z=700 $\mu$m, has been improved by 2 dB as compared to sample in which z=500 $\mu$m.

It is noted that the ladder filter of the present invention is not limited to the above-mentioned preferred embodiments and may be varied in various ways within the scope of the gist thereof.

While the invention has been particularly shown and described with reference to preferred embodiments thereof, it will be understood by those skilled in the art that the foregoing and other changes in form and details may be made therein without departing from the spirit of the invention.

What is claimed is:

1. A ladder filter, comprising:

a case;

first, second and third series piezoelectric resonators located in the case;

first, second and third parallel piezoelectric resonators located in the case; and a plurality of terminal members which connect the first, second and third series piezoelectric resonators and the first, second and third parallel piezoelectric resonators in a ladder configuration and support the first, second and third series piezoelectric resonators and the first, second and third parallel piezoelectric resonators in the case so that the first, second and third series piezoelectric resonators and the first, second and third parallel piezoelectric resonators resonate freely; wherein the case has a first storage section and a second storage section adjacent to each other;

the first and second series piezoelectric resonator and the second parallel piezoelectric resonator are stored in the first storage section such that the second series piezoelectric resonator is located between the first series piezoelectric resonator and the second parallel piezoelectric resonator;

the first and third parallel piezoelectric resonators and the third series piezoelectric resonator are stored in the second storage section such that the third parallel piezoelectric resonator is located between the first parallel piezoelectric resonator and the third series piezoelectric resonator; and the first series piezoelectric resonator and the first parallel piezoelectric resonator are adjacent to each other in the case.

2. The ladder filter according to claim 1, wherein a first input/output terminal is electrically connected to the first series piezoelectric resonator;

a second input/output terminal is electrically connected to the third parallel piezoelectric resonator; and the first series piezoelectric resonator and the first parallel piezoelectric resonator are disposed on a side of the case which includes a mounting surface of said case.

3. The ladder filter according to claim 1, wherein the third series piezoelectric resonator is thicker than each of the first and second series piezoelectric resonators.

4. The ladder filter according to claim 1, wherein the plurality of terminals and each of the first, second and third series piezoelectric resonators and the first, second and third parallel piezoelectric resonators are arranged such that each adjacent pair of the resonators are separated from each other only by one of the plurality of terminals.

5. A ladder filter, comprising:

a case;

a plurality of series piezoelectric resonators located in the case;

a plurality of parallel piezoelectric resonators located in the case; and a plurality of terminal members which connect the series piezoelectric resonators and the parallel piezoelectric resonators in a ladder configuration and support the series piezoelectric resonators and the parallel piezoelectric resonators in the case so that the series piezoelectric resonators and the parallel piezoelectric resonators resonate freely; wherein the plurality of terminals and each of the series piezoelectric resonators and the parallel piezoelectric resonators are arranged such that each adjacent pair of the resonators is separated from each other only by one of the plurality of terminals;

the plurality of series piezoelectric resonators includes first, second and third series piezoelectric resonators located in the case and the plurality of parallel piezoelectric resonators includes first, second and third parallel piezoelectric resonators located in the case and the case includes a first storage section and a second storage section located adjacent to each other; and the first and second series piezoelectric resonators and the second parallel piezoelectric resonator are stored in the first storage section such that the second series piezoelectric resonator is located between the first series piezoelectric resonator and the second parallel piezoelectric resonator.

6. The ladder filter according to claim 5, wherein the third series piezoelectric resonator is thicker than each of the first and second series piezoelectric resonators.

7. A ladder filter according to claim 5, wherein the first and third parallel piezoelectric resonators and the third series piezoelectric resonator are stored in the second storage section such that the third parallel piezoelectric resonator is located between the first parallel piezoelectric resonator and the third parallel piezoelectric resonator; and the first series piezoelectric resonator and the first parallel piezoelectric resonator are adjacent to each other in the case.

8. The ladder filter according to claim 5, wherein a first input/output terminal is electrically connected to the first series piezoelectric resonator;

a second input/output terminal is electrically connected to the third parallel piezoelectric resonator; and the first series piezoelectric resonator and the first parallel piezoelectric resonator are disposed on a side of the case which includes a mounting surface of said case.

* * * * *